(12) United States Patent
Van Brocklin (10) Patent No.: US 9,221,251 B2
(45) Date of Patent: Dec. 29, 2015

(54) ADAPTIVE LEVEL SHIFTER FOR PRINT NOZZLE AMPLIFIER

(75) Inventor: Andrew Van Brocklin, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/374,751

(22) PCT Filed: Apr. 25, 2012

(86) PCT No.: PCT/US2012/034930
§ 371 (c)(1),
(2), (4) Date: Jul. 25, 2014

(87) PCT Pub. No.: WO2013/162539
PCT Pub. Date: Oct. 31, 2013

(65) Prior Publication Data
US 2015/0210071 A1     Jul. 30, 2015

(51) Int. Cl.
*B41J 29/38* (2006.01)
*B41J 2/045* (2006.01)
*H03K 19/0185* (2006.01)

(52) U.S. Cl.
CPC ............ *B41J 2/04541* (2013.01); *B41J 2/0452* (2013.01); *B41J 2/04581* (2013.01); *B41J 2/04586* (2013.01); *H03K 19/018521* (2013.01)

(58) Field of Classification Search
CPC ............... B41J 2/04541; B41J 2/04581; B41J 2/04588; B41J 2/04596
USPC ........................................... 347/9–11, 54, 68
See application file for complete search history.

(56) References Cited

U.S. PATENT DOCUMENTS

| | | | |
|---|---|---|---|
| 6,450,624 B1 | 9/2002 | De Roos et al. | |
| 6,929,340 B2 * | 8/2005 | Ishizaki | 347/5 |
| 7,019,560 B2 | 3/2006 | Wimmer et al. | |
| 7,339,433 B2 | 3/2008 | Bhatacharya et al. | |
| 7,857,413 B2 | 12/2010 | Shamoun | |
| 7,928,784 B2 | 4/2011 | Li et al. | |
| 2003/0122899 A1 | 7/2003 | Kojoh et al. | |
| 2008/0018686 A1 | 1/2008 | Oshima et al. | |
| 2008/0246512 A1 | 10/2008 | Seth et al. | |

FOREIGN PATENT DOCUMENTS

WO   WO-2009147555 A1   12/2009

OTHER PUBLICATIONS

International Search Report for corresponding PCT/US2012/034930, filed Apr. 25, 2012, completed Dec. 28, 2012 by Kang Hyun Il of the KIPO.

Lopez-Martin, et al.: "Low-Voltage Super Class AB CMOS OTA Cells with Very High Slew Rate and Power Efficiency"; http://ieeexplore.ieee.org/xpls/abs_all.jsp?arnumber=1425714; pp. 1068-1077, vol. 40.

* cited by examiner

*Primary Examiner* — An Do
(74) *Attorney, Agent, or Firm* — Tarolli, Sundheim, Covell & Tummino L.L.P.

(57) ABSTRACT

An apparatus includes an amplifier to provide a waveform to drive a print nozzle. The amplifier also provides a current proportional to a slew rate of the waveform. A pass gate to applies the waveform to the print nozzle in response to a drive signal. A level shifter adjusts the drive signal based on the current.

20 Claims, 6 Drawing Sheets

ADAPTIVE LEVEL SHIFTER FOR PRINT NOZZLE AMPLIFIER

RELATED APPLICATIONS

The present invention is a U.S. National Stage under 35 USC 371 patent application, claiming priority to Serial No. PCT/US2012/034930, filed on 25 Apr. 2012, the entirety of which is incorporated herein by reference.

BACKGROUND

Print heads employ nozzles to dispense ink when commanded by electronic circuits such as operational amplifiers. One style of print head is a piezo head where voltages applied by the amplifiers to the piezo element of the print head cause ink to dispense from the head and associated nozzle. Current commercial piezo heads have drivers that use a cold switch circuit where there is a high power, high voltage operational amplifier that is located separately from the print head area, and connected typically by a single wire to the print head. This wire carries the waveform that all ink dispensing nozzles utilize. Conventional cold switch designs generally have one pass gate per nozzle to switch a common cold driver bus to the nozzle, where the pass gates are controlled by per-nozzle print data. Pass gates are costly in terms of power, because gate voltages of the pass gate transistor must follow the nozzle driving waveform. Thus, parasitic coupling capacitances from gate to source and drain must be overcome. Such currents should be sufficient for the capacitances and slew rates involved.

DETAILED DESCRIPTION

Figure 1:
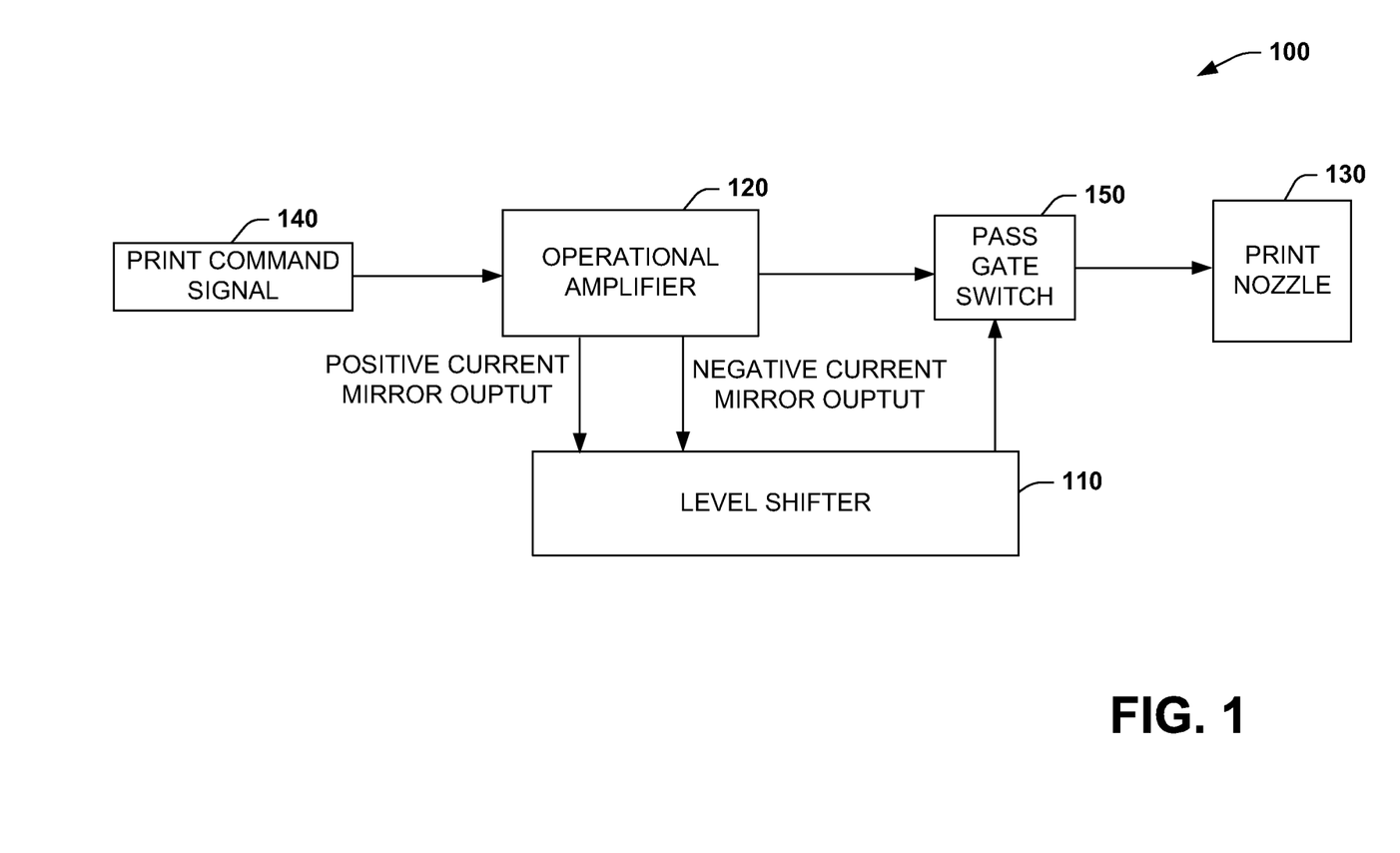
FIG. 1 illustrates an example apparatus that utilizes an adaptive level shifter in conjunction with an operational amplifier to drive a print nozzle.

FIG. 1 illustrates an example apparatus 100 that utilizes an adaptive level shifter 110 in conjunction with an operational amplifier 120 that drives a print nozzle 130. As shown, a print command signal 140 (e.g., voltage signal that commands ink to be dispensed from the print nozzle) is applied to an input of the operational amplifier having gain control feedback 120 that amplifies the signal and applies it to the level shifter 110 that activates a pass gate 150 to drive the print nozzle 130. The operational amplifier 120 provides a waveform derived from the print command signal 140 to drive a print nozzle 130, wherein the operational amplifier also provides a current proportional to a slew rate of the waveform. The pass gate 150 applies the waveform to the print nozzle 130 in response to a drive signal. The level shifter 110 then adjusts the drive signal based on the current.

The operational amplifier 120 can generate a positive or negative current mirror output current, wherein the positive or negative current mirror output current is proportional to a slew rate of a waveform generated by the operational amplifier to drive the print nozzle 130. The level shifter 110 monitors the positive or negative current mirror output current to adaptively compensate (e.g., adjust current based on capacitance of pass gate) for the current needs of the pass gate switch 150 that passes a power waveform from the operational amplifier 120 to the print nozzle 130. For example, capacitive coupling in the pass gate 150 can cause excessive steady state bias current to be required and hence excessive power to be dissipated in the pass gate and associated pass gate driver circuitry unless such an adaptive biasing method is employed as described herein.

By utilizing the level shifter 110 with proportional slew rate control provided by the operational amplifier 120, power dissipation in the pass gate 150, operational amplifier 120, and overall print nozzle driver circuit can be mitigated. Additionally, the operational amplifier 120 can be operated in class A-B mode to generate the positive and negative current mirror output currents to further reduce system power. Class A-B or B can employed to generate adaptive currents, where using class A operation, for example, the currents would be steady and hence there would be substantially no power reduction. Multiple stage operation can also be provided for the operational amplifier 120 wherein one stage could be configured as class A, A-B or class B and a subsequent stage (or subsequent stages) could be configured as class A, A-B or class B, for example. The reduced power savings can be further enhanced since there can be hundreds of print nozzles 130—each requiring their own operational amplifier 120, level shifter 110, and pass gate 150 to command ink dispersal from the respective print nozzles. In an alternative example, adaptive level shifting can be applied to a common amplifier that in turn drives a plurality of print nozzles. In either case, adaptive level shifting can be applied to amplifiers on a per nozzle basis where each nozzle is operated by its own respective operational amplifier 120, level shifter 110, and pass gate 150, or alternatively, a common amplifier (e.g., also referred to as a cold switch driver) can employ adaptive level shifting to operate a plurality of pass gates 150 and associated print nozzles 130. Although not shown, a control signal for test and amplifier reset can be applied to the level shifter 110. Such control signal can provide digital switch control waveforms to the level shifter 110 for adaptive biasing and switching.

In one example, the level shifter 110 can be applied to a high voltage switch operating as the pass gate 150 to drive a piezo nozzle level amplifier or cold switch piezo driver for a piezo print head operating the print nozzle 130 that can meet demanding requirements of low circuit area usage, high voltage operation, high slew rate and low bias (overhead) power dissipation. Thus, print nozzle piezo print heads require a method to amplify a desired waveform per nozzle that also mitigates circuit area and corresponding power dissipation. The level shifter 110 can employ a mirroring of class A-B current from either an amplifier stage or from a slew rate sensing differentiator (for the cold switch case), where each case will be illustrated and described with respect to FIGS. 3 and 4.

Current high voltage level shifters used in piezo print heads are digital, in that they are either on or off to select nozzles to connect to a cold driver. The level shifter that shifts from logic level where the print data is present, to the high voltage needed to turn a transistor on or off requires significant power because of the slew rate of the cold driver signal. The adaptive level shifting methods described herein adapt the current in the level shifter 110 to the needs of the high voltage switch operative in the pass gate 150. The current needed in the level shifter 110 and hence pass gate 150 is proportional to the slew rate, given that the level shifter has to overcome the capacitive coupling of the pass gate transistor from its gate to the signal it is passing through from source to drain or vice versa, for example.

For purposes of simplification of explanation, in the present example, different components of the systems described herein are illustrated and described as performing different functions. However, one of ordinary skill in the art will understand and appreciate that the functions of the described components can be performed by different components, and the functionality of several components can be combined and executed on a single component or be further distributed across more components. The components can be implemented, for example, as an integrated circuit or as discrete components, or as a combination of both. In other examples, the components could be distributed among different printed circuit boards, for example.

Figure 2:
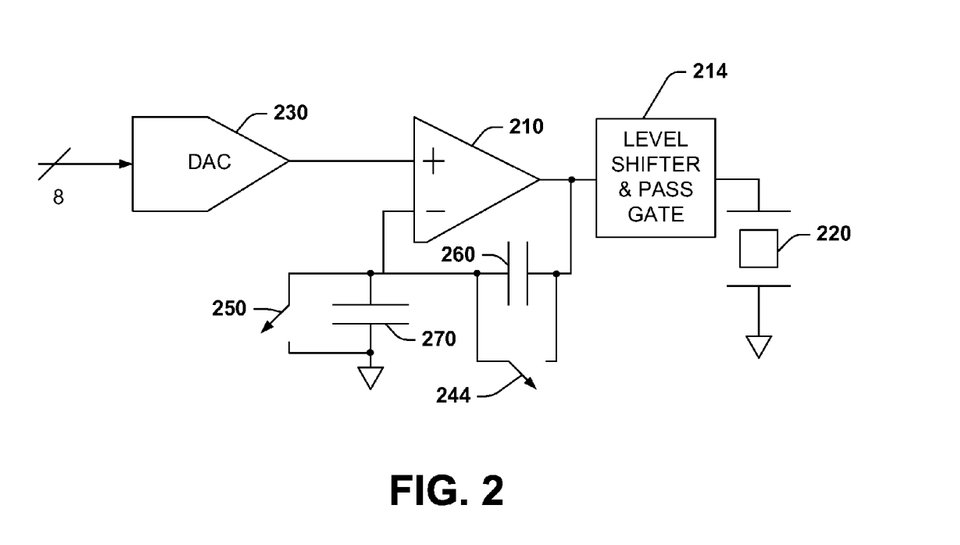
FIG. 2 illustrates an example operational amplifier that employs an adaptive level shifter and pass gate to drive a piezo print nozzle.

FIG. 2 illustrates an example operational amplifier 210 that employs an adaptive level shifter and pass gate 214 to drive a piezo print nozzle 220. An eight bit signal DAC 230 can be employed to send a print command signal to the operational amplifier 210 which in turn amplifies the signal to drive the piezo print nozzle 220 via the level shifter 214 and pass gate. Although an eight DAC 230 is shown, other bit resolutions are possible (e.g., 12 bit DAC, 7 bit DAC, and so forth). Various switching components (e.g., FET, transistor) are shown at 244 and 250, wherein such switching components form reset controls for capacitors operating as feedback in the operational amplifier 210. Capacitors 260 and 270 form a capacitive feedback network and can be reset via switching components 244 and 250, respectively. The capacitors 260 and 270 form a capacitive divider as a feedback for the gain of the operational amplifier 210, wherein the gain can be defined as the ratio of any two impedances. If the impedances have different frequency responses, then the amplifier formed using this feedback structure can have a frequency response altered by this characteristic, as well as defining the gain.

The capacitive elements 260 and 270 are variable with frequency. However, it is desirable to have feedback that is substantially frequency independent, over the amplifier frequency range of interest, which is defined by the period and the frequency response; e.g., minimum of fmin=1/30 us=33 KHz and a maximum of fmax~=M*K/Tr, where Tr is the 200 ns rise time, M=4 is the settling factor and K is the proportionality for one time constant, fmax~=4*0.35/200 n=7 MHz. The gain response frequency through this bandwidth of the capacitive feedback elements 260 and 270 is $T(\omega)=(1/(Cl*\omega))/(1/(Ch*\omega)+1/(Cl*\omega))$, where Cl is for capacitor 270, Ch is for capacitor 260, and w is the frequency. The $\omega$ drops out of the equation as long as the frequency is kept above 0 and series resistive elements are small enough to be neglected. The resulting transfer function can be represented as $T=(1/(Cl))/(1/(Ch)+1/(Cl))$, which is substantially frequency independent, as desired. In order to actually provide the lowest frequency bandwidth at 33 KHz, for example, the capacitors 260 and 270 should be reset to provide some direct current (DC) value stabilization. Otherwise, the $\omega$ in the denominator of the $T(\omega)$ transfer function may cause undesirable drift in the driving waveform. In general, an undesirable charge can build up in the capacitors 260 and 270 over time if they are not reset.

Figure 3:
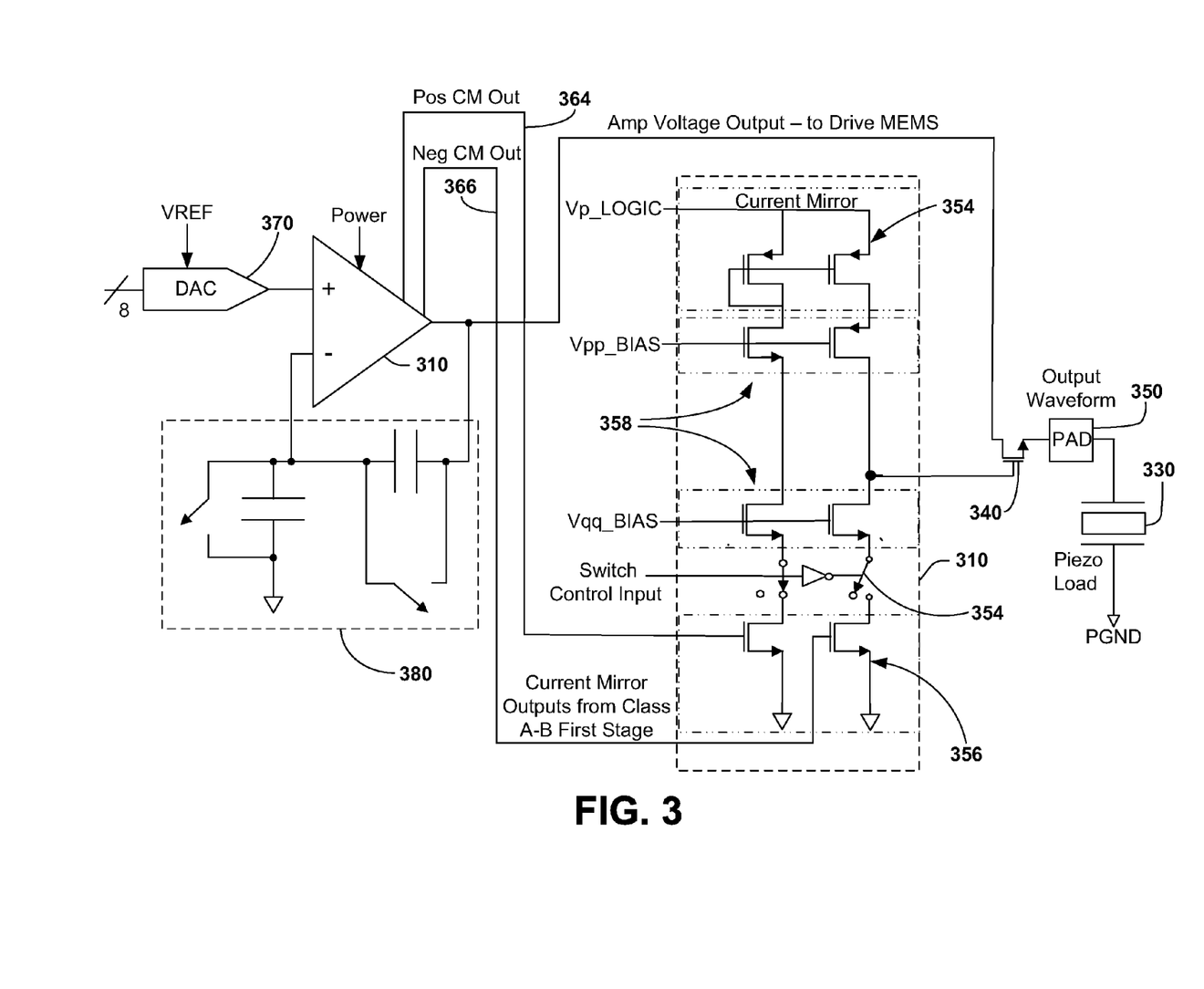
FIG. 3 illustrates a class A-B nozzle amplifier that employs an adaptive level shifter to control a piezo print nozzle.

FIG. 3 illustrates a class A-B nozzle amplifier 310 that employs an adaptive level shifter 320 to control a piezo print nozzle 330. The level shifter 320 drives a pass gate transistor 340 which in turn drives print head pad 350 which connects to the piezo print nozzle 330. As shown, the upper portion of the level shifter 320 can include two gates configured as an upper current mirror at 354, wherein the gates of the upper current mirror are configured as PMOS devices, for example. A lower portion of the level shifter 320 can include a lower current mirror 356 with each of the two gates in the lower current mirror configured as NMOS devices, for example. High voltage protection can be provided such as shown at 358. A control switch 360 can be provided to activate or deactivate the current mirrors of the level shifter 320. A positive and negative current mirror output at 364 and 366 respectively can be generated from the nozzle amplifier 310 and employed to drive the level shifter 320. As shown, an eight bit DAC 370 (or other resolution) can provide a print command voltage for the nozzle amplifier 310. A capacitive feedback with reset control can be provided as amplifier feedback at 380.

In one example, the level shifter 320 operates on the principle of monitoring current in the first stage of the operational amplifier 310 used to amplify per-nozzle waveforms to modulate the current in the level shifter. There can be a positive output current and a negative output current mirror output at 364 and 366 from the per-nozzle amplifier. Such current mirror outputs 364 and 366 can be proportional to the slew rate of the waveform being driven on to the nozzle control device such as a micro-electromechanical system (MEMS), for example, and hence to the proportional need for current in the level shifter 320. Since the current needed in the level shifter 320 is proportional to the slew rate, given that the level shifter should overcome the capacitive coupling of the pass gate transistor from its gate to the signal it is passing, this adaptive system tailors the current used to the needs of the level shifter, thereby reducing the power dissipation. Class-AB current is on average 1/10th to 1/100th of the peak current needed and can reduce the level shifter power dissipation by that amount.

Figure 4:
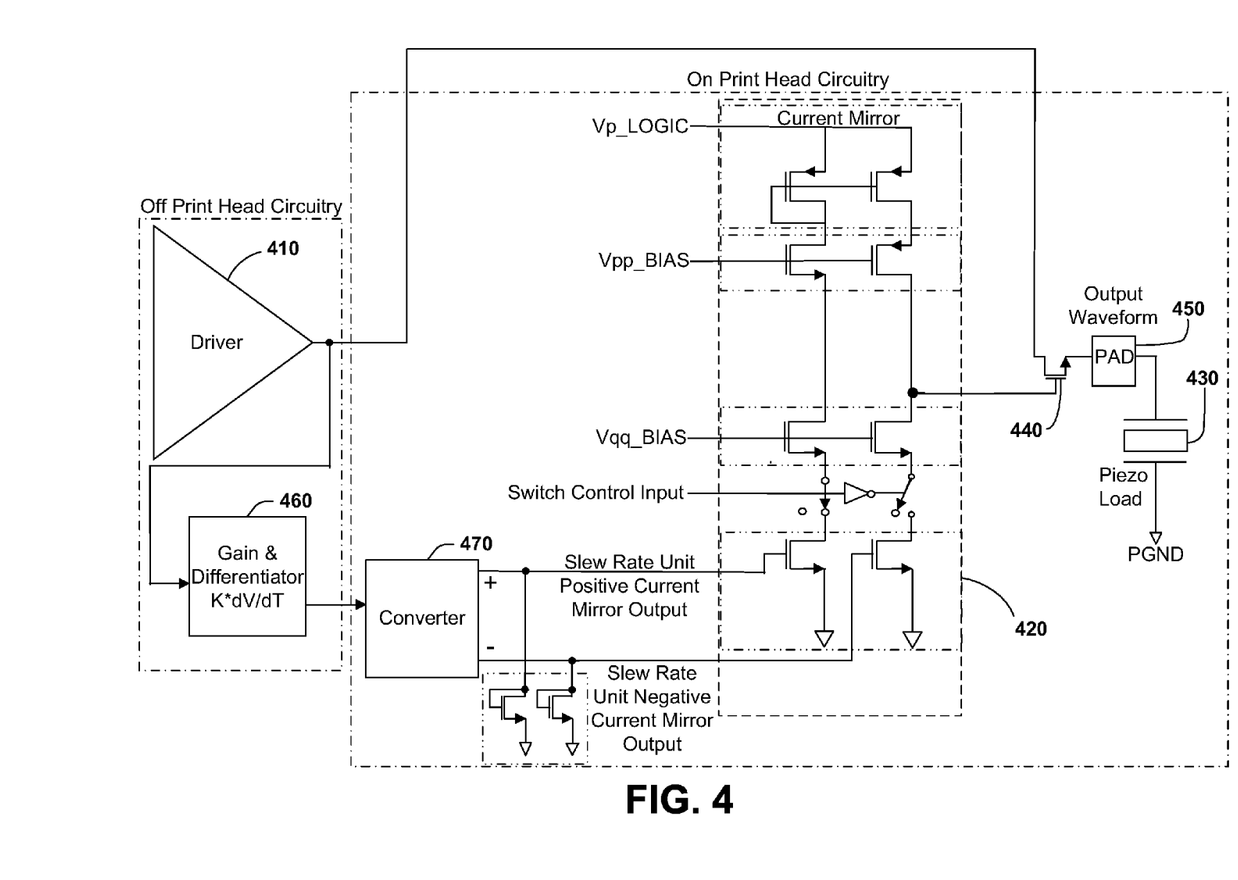
FIG. 4 illustrates a cold switch driver that employs an adaptive level shifter to control a piezo print driver.

FIG. 4 illustrates a cold switch driver 410 that employs an adaptive level shifter 420 to control a piezo print driver 430. The level shifter 420 drives a pass gate transistor 440 which in turn drives print head pad 450 which connects to the piezo print nozzle 430. The cold switch driver 410 can drive a gain & differentiator module 460 that in turn drives a differential voltage to current converter 470 which slew-rate controlled positive and negative current mirror outputs for the level shifter 420.

The level shifter 420 can operate on the principle of monitoring the slew rate of the voltage driven onto the print head by the cold switch driver 410 and differentiating that to control the current in the level shifter. The output waveform on the cold switch driver can be monitored by the gain and differentiator module 460. The output of this module 460 can have a level that is proportional in magnitude and polarity to the slew rate of the waveform driving the print nozzle 430. Since the current needed in the level shifter 420 is proportional to the slew rate, given that the level shifter should overcome the capacitive coupling of the pass gate transistor 440, from its gate to the signal it is passing, this adaptive system tailors the current used to the needs of the level shifter, thereby reducing the power dissipation.

Figure 5:
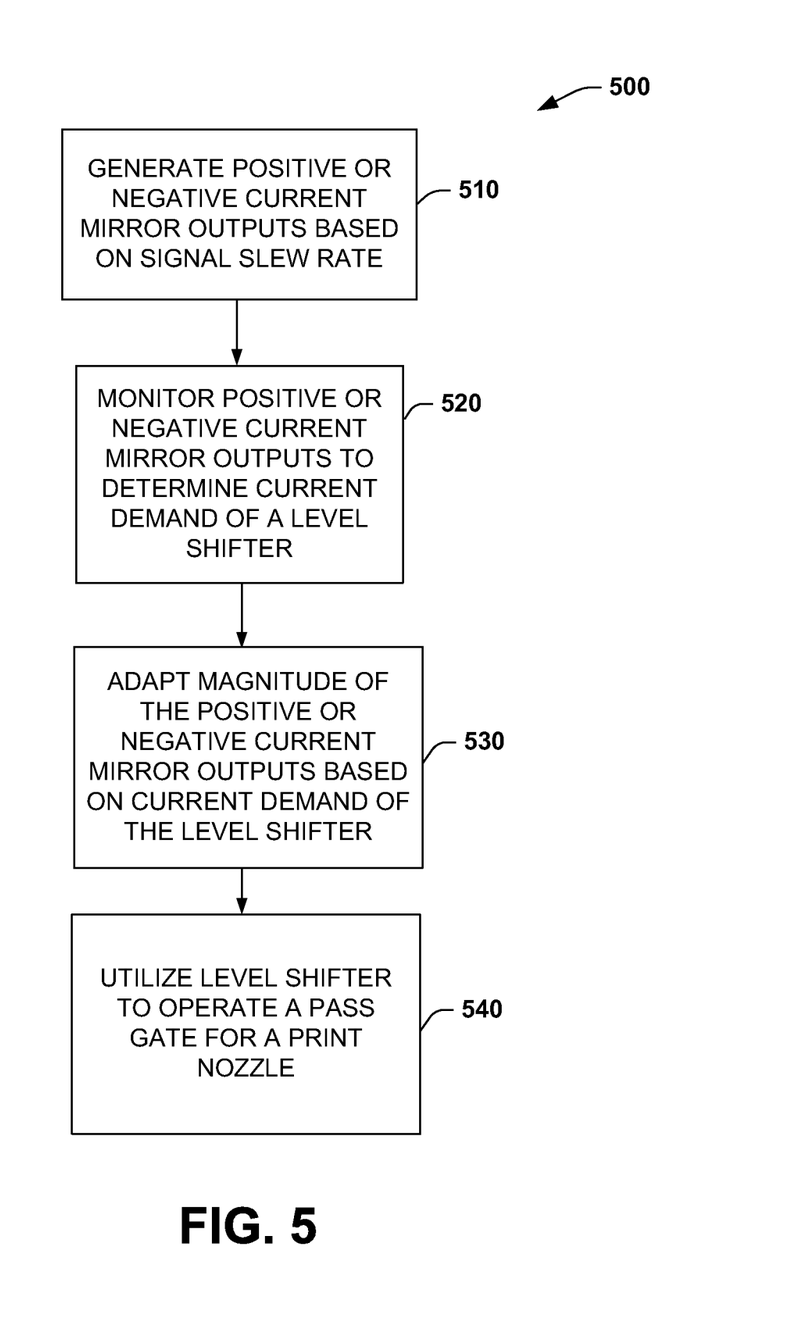
FIG. 5 illustrates an example method for adaptive level shifting to drive a print nozzle.

In view of the foregoing structural and functional features described above, an example method will be better appreciated with reference to FIG. 5. While, for purposes of simplicity of explanation, the method is shown and described as executing serially, it is to be understood and appreciated that the method is not limited by the illustrated order, as parts of the method could occur in different orders and/or concurrently from that shown and described herein.

FIG. 5 illustrates an example method 500 for adaptive level shifting to drive a print nozzle. The method 500 generates positive or negative current mirror outputs at 510. Such outputs can be driven from an operational amplifier such as the operational amplifier 120 depicted in FIG. 1 above, for example. At 520, the method 500 monitors the positive or negative current mirror outputs that are based on the signal slew rate of the print nozzle driving signal to determine current demands for a level shifter for a print nozzle. Such current demands can be influenced by capacitance found in pass gates that drive print nozzles, for example. At 530, the method 500 adapts a magnitude of the positive or negative current mirror outputs based on the current demand of the level shifter. At 540, the method 500 utilizes the level shifter to operate a pass gate for a print nozzle.

Figure 6:
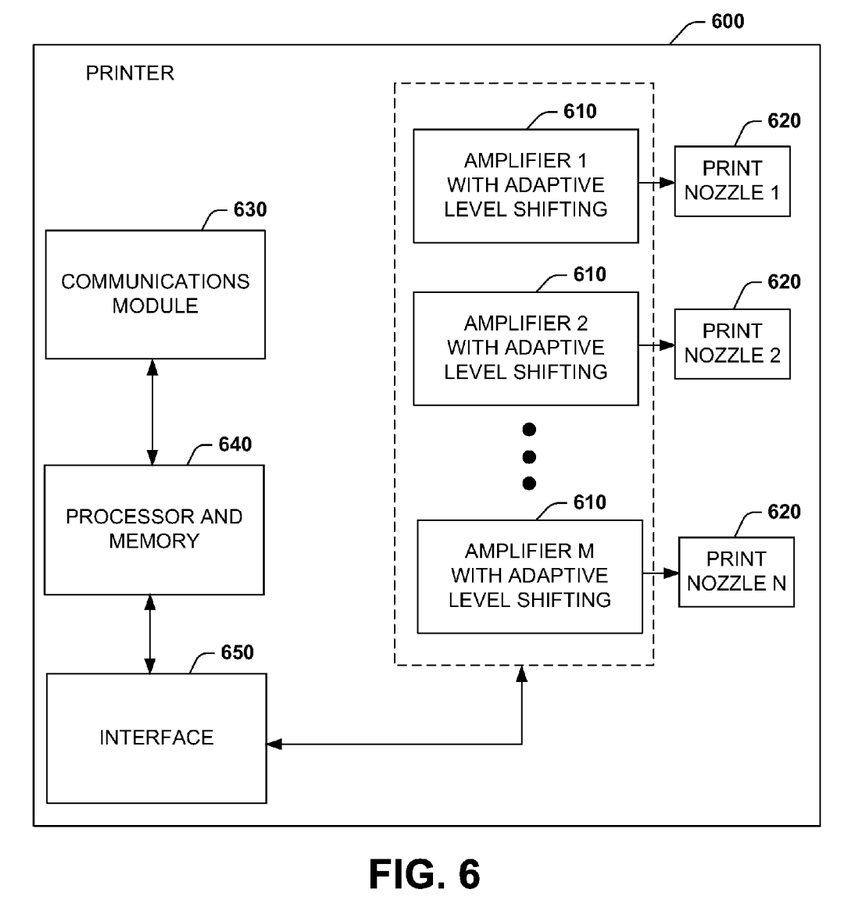
FIG. 6 illustrates an example printer that employs amplifiers utilizing adaptive level shifting to drive a plurality of print nozzles.

FIG. 6 illustrates an example printer 600 that employs amplifiers 610 utilizing adaptive level shifting to drive a plurality of print nozzles 620. The print nozzles 620 are shown as nozzles 1 through N, with N representing a positive integer. The respective print nozzles 620 are driven from a corresponding amplifier 610 shown as amplifiers 1 though M, with M representing a positive integer. Each of the respective amplifiers 610 employ adaptive level shifting and slew rate controls as previously described. The printer 600 can also include a communications module 630 for receiving print commands and updating printer status. The communications module 630 can include local connections such as from a print cable and/or can include remote network connections such as can be received from a local network and/or over a public network such as the Internet, for example. The communications module 630 can be operated by a processor and memory module 640 which can include executable operating instructions to operate the printer 600. Such instructions can operate the method 500 described above with respect to FIG. 5, for example, to generate drive waveforms at the print nozzles 620 and operations in the amplifiers 610. The processor and memory module 640 can also connect to an interface module 650 that performs digital to analog conversions among other interface operations to control the amplifiers 610.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An apparatus, comprising:
   an amplifier to provide a waveform to drive a print nozzle, the amplifier also providing a current proportional to a slew rate of the waveform;
   a pass gate to apply the waveform to the print nozzle in response to a drive signal; and
   a level shifter that adjusts a current level of the drive signal applied to the pass gate based on the current and a capacitive coupling of the pass gate.

2. The apparatus of claim 1, wherein the current proportional to the slew rate is a positive or negative current mirror output current.

3. The apparatus of claim 1, wherein the amplifier is configured as a class A-B amplifier or a class B amplifier to generate the positive or negative mirror output current.

4. The apparatus of claim 1, wherein the amplifier is configured as a multiple stage amplifier having a class AB configuration for one stage and a class B configuration for a second stage.

5. The apparatus of claim 1, wherein the apparatus is implemented as a micro-electromechanical system (MEMS) to drive the print nozzle.

6. The apparatus of claim 5, wherein the print nozzle is a piezo print nozzle that is driven from the MEMS.

7. The apparatus of claim 1, wherein the level shifter further comprises a current mirror to bias a switch to control the pass gate.

8. The apparatus of claim 1, wherein the amplifier is configured as a cold switch driver to drive a plurality of pass gates that drive a plurality of print nozzles.

9. The apparatus of claim 8, further comprising a gain and differentiator component that receives output from the cold switch driver to generate a waveform for the plurality of print nozzles.

10. The apparatus of claim 9, further comprising a differential voltage to current converter that receives output from the gain and differentiator component to generate the waveform for the plurality of print nozzles.

11. The apparatus of claim 1, wherein the level shifter receives a control signal control biasing and switching of the pass gate.

12. The apparatus of claim 1, further comprising a capacitive divider as a feedback network for a gain of the operational amplifier.

13. The apparatus of claim 12, the capacitive divider comprising a first and a second capacitor.

14. The apparatus of claim 13, wherein the gain can be defined as the ratio of any two impedances.

15. The apparatus of claim 13, the capacitive divider comprising one or more switching components to reset the capacitive divider.

16. The apparatus of claim 1, wherein the current of the drive signal from the level shifter is effective to reduce power dissipation.

17. A printer, comprising:
   a plurality of print nozzles;
   a plurality of operational amplifiers to drive the print nozzles, wherein each of the plurality of operational amplifiers provide a waveform to drive the plurality of print nozzles, the plurality of operational amplifiers also providing a current proportional to a slew rate of the waveform;
   a pass gate associated with each of the plurality of operational amplifiers to apply the waveform to the plurality of print nozzles in response to a drive signal; and
   a level shifter associated with each of the plurality of operational amplifiers that adjust a current level of the drive signal applied to the pass gate based on the current proportional to the slew rate and a capacitive coupling of the pass gate; and
   a processor and memory module to direct remote print commands to the operational amplifiers to cause ink to be dispensed from the print nozzles.

18. The printer of claim 17, wherein the plurality of operational amplifiers each generate positive and negative current mirror outputs to drive the level shifter.

19. A method, comprising:
   providing a slew rate signal to a pass gate to drive a print nozzle;

generating a current proportional to the slew rate signal;
monitoring the current to determine current demands for a level shifter to drive the print nozzle;
generating a drive signal that varies based on the determined current demands and a capacitance of the pass gate; and
applying the drive signal to the pass gate to drive the print nozzle.

20. The method of claim 19, further comprising generating a positive or negative current mirror output as the current proportional to the slew rate signal.

* * * * *